United States Patent
Fang et al.

(10) Patent No.: US 11,189,577 B2
(45) Date of Patent: Nov. 30, 2021

(54) SEMICONDUCTOR STRUCTURE

(71) Applicant: PlayNitride Display Co., Ltd., Zhunan Township (TW)

(72) Inventors: Hsin-Chiao Fang, Zhunan Township (TW); Shen-Jie Wang, Zhunan Township (TW); Yen-Lin Lai, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 0 days.

(21) Appl. No.: 16/840,823

(22) Filed: Apr. 6, 2020

(65) Prior Publication Data

US 2021/0134737 A1    May 6, 2021

(30) Foreign Application Priority Data

Nov. 6, 2019    (TW) .................................. 108140245

(51) Int. Cl.
H01L 23/00        (2006.01)
H01L 21/02        (2006.01)
H01L 29/20        (2006.01)

(52) U.S. Cl.
CPC ........ *H01L 23/562* (2013.01); *H01L 21/0242* (2013.01); *H01L 21/0254* (2013.01); *H01L 21/0262* (2013.01); *H01L 21/02422* (2013.01); *H01L 21/02458* (2013.01); *H01L 21/02488* (2013.01); *H01L 21/02499* (2013.01); *H01L 29/2003* (2013.01)

(58) Field of Classification Search
None
See application file for complete search history.

(56) References Cited

U.S. PATENT DOCUMENTS

RE38,466 E * 3/2004 Inoue ................ H01L 21/76251
                                                        438/30
2010/0140745 A1   6/2010 Khan et al.
2016/0013364 A1 * 1/2016 Cha ......................... H01L 33/18
                                                        438/34

OTHER PUBLICATIONS

Ohring, "Epitaxy", 2002, Materials Science of Thin Film (second edition), Chapter 8, Section 8.2.1 (excerpted from Chapter 8), p. 1. (Year: 2002).*
Taiwanese Office Action and Search Report for Taiwanese Application No. 108140245, dated Oct. 23, 2020.

* cited by examiner

*Primary Examiner* — Bo B Jang
(74) *Attorney, Agent, or Firm* — Birch, Stewart, Kolasch & Birch, LLP

(57) ABSTRACT

A semiconductor structure is provided. The semiconductor structure includes a substrate. The semiconductor structure also includes a buffer layer disposed on the substrate. The semiconductor structure further includes a first semiconductor layer disposed on the buffer layer. The buffer layer includes a first buffer structure and a second buffer structure partially disposed on the first buffer structure. The material of the first buffer structure is different from the material of the second buffer structure.

12 Claims, 3 Drawing Sheets

SEMICONDUCTOR STRUCTURE

CROSS REFERENCE TO RELATED APPLICATIONS

This application claims the benefit of Taiwan Application No. 108140245, filed Nov. 6, 2019, the entirety of which is incorporated by reference herein.

BACKGROUND

Technical Field

Embodiments of the present disclosure relate to a semiconductor structure, and in particular they relate to a semiconductor structure that includes a buffer layer made of a heterogeneous material structure.

Description of the Related Art

In the process of manufacturing a semiconductor structure, there may be a large lattice mismatch between different stacked layers (e.g., between the substrate and the AlGaN layer), resulting in a high-density dislocation during epitaxy, which in turn affects the performance of subsequent devices. Silicon nitride masks are often used as a buffer layer to reduce the dislocation. However, this method requires lateral growth of the epitaxial layer to a certain thickness in order to effectively reduce the dislocation of the epitaxial layer. In addition, there is a large stress change while the epitaxial layer is being completed in this way and the temperature is dropping to room temperature, which can easily cause cracks to form in the epitaxial layer. Therefore, there is a need for a semiconductor structure to more effectively reduce the dislocation of the epitaxial layer and prevent cracking.

SUMMARY

In the semiconductor of the embodiments of the present disclosure, the buffer layer may be made of a heterogeneous material structure, so that the buffer layer may include a first buffer structure and a second buffer structure, thereby effectively reducing the dislocation and making the stress in the semiconductor structure uniform to prevent the semiconductor structure from cracking.

Some embodiments of the present disclosure include a semiconductor structure. The semiconductor structure includes a substrate. The semiconductor structure also includes a buffer layer disposed on the substrate. The semiconductor structure further includes a first semiconductor layer disposed on the buffer layer. The buffer layer includes a first buffer structure and a second buffer structure partially disposed on the first buffer structure. The material of the first buffer structure is different from the material of the second buffer structure.

In some embodiments, the thickness of the second buffer structure is greater than the thickness of the first buffer structure.

In some embodiments, the contact area of the first semiconductor layer and the first buffer structure is smaller than the contact area of the first semiconductor layer and the second buffer structure.

In some embodiments, the ratio the area of the orthographic projection of the first buffer structure on the substrate to the area of the orthographic projection of the second buffer structure on the substrate is between 10% and 90%.

In some embodiments, the first buffer structure has a plurality of first sub-regions, at least some intervals of the first sub-regions are different, the second buffer structure has a plurality of second sub-regions, and at least some intervals of the second sub-regions are different.

In some embodiments, the first semiconductor layer is disposed between a surface of each of the first sub-regions and the second sub-regions.

In some embodiments, the first sub-regions and the second sub-regions form a continuous structure.

In some embodiments, two adjacent first sub-regions have a first interval, two adjacent second sub-regions have a second interval, and the first interval is different from the second interval.

In some embodiments, each of the first sub-regions has irregular sidewalls, and each of the second sub-regions has irregular sidewalls.

In some embodiments, the material of the first buffer structure includes an insulating material, and the material of the second buffer structure includes a semiconductor material.

In some embodiments, the semiconductor structure further includes a second semiconductor layer disposed between the substrate and the buffer layer.

In some embodiments, the material of the first semiconductor layer is the same as the material of the second semiconductor layer.

In some embodiments, the density of the dislocation of the first semiconductor layer is smaller than the density of the dislocation of the second semiconductor layer.

In some embodiments, the second buffer structure is partially disposed on a surface of the first buffer structure, and the ratio of the area of the second buffer structure disposed on the surface of the first buffer structure to the area of the surface of the first buffer structure is between 10% and 50%.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
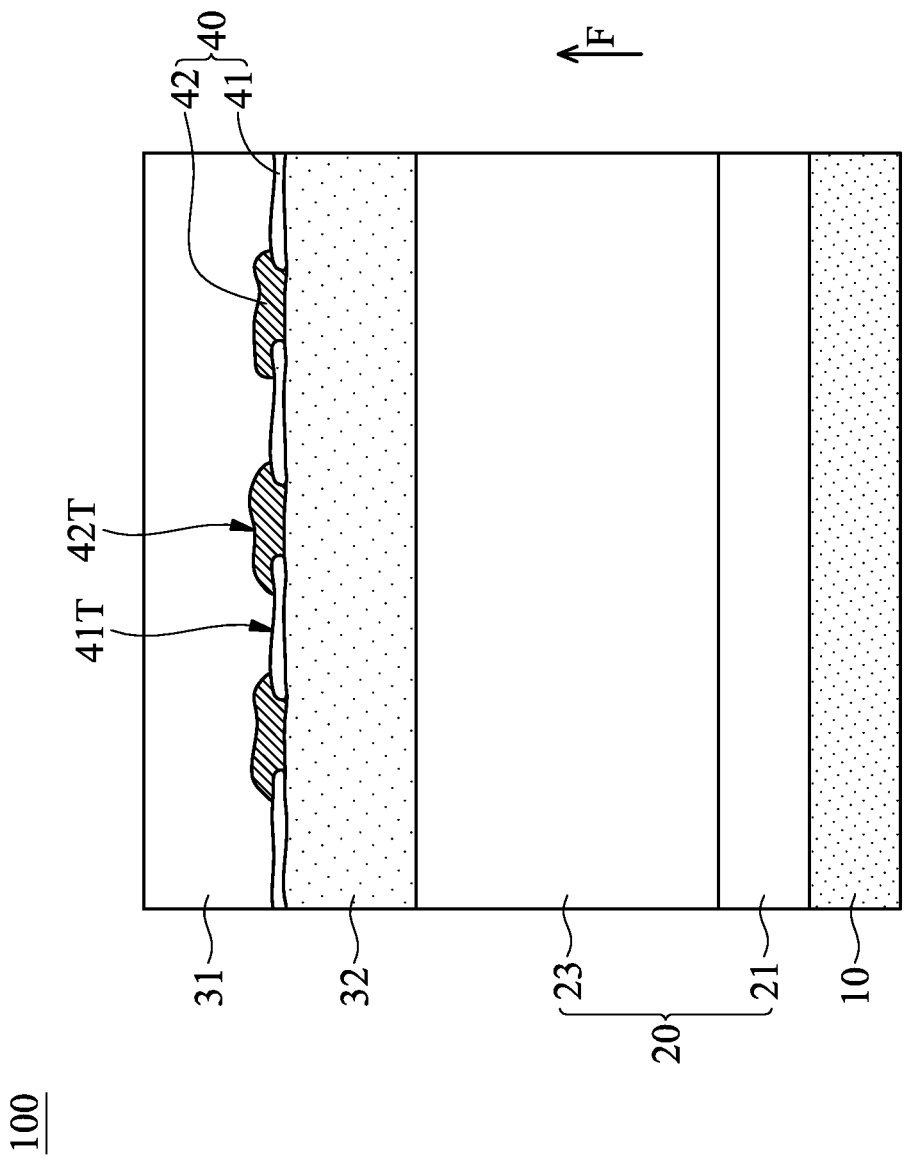
FIG. 1 is a partial cross-sectional view illustrating a semiconductor structure according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +1-0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
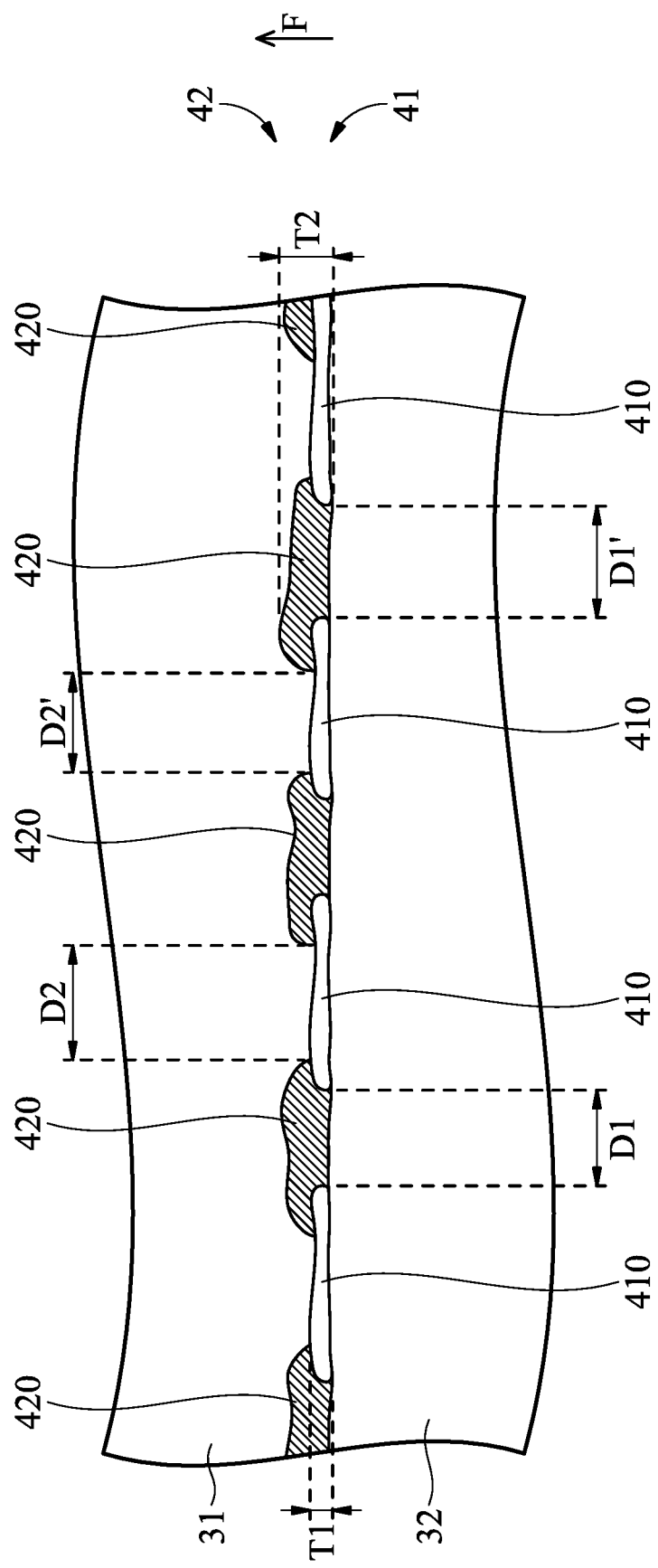
FIG. 2 is a partially enlarged schematic diagram of the semiconductor structure of FIG. 1.

FIG. 1 is a partial cross-sectional view illustrating a semiconductor structure 100 according to one embodiment of the present disclosure. FIG. 2 is a partially enlarged schematic diagram of the semiconductor structure 100 of FIG. 1. It should be noted that some components may be omitted in FIG. 1 and FIG. 2 in order to more clearly illustrate the features of the embodiments of the present disclosure.

Referring to FIG. 1, the semiconductor substrate 100 according to the embodiments of the present disclosure includes a substrate 10. The semiconductor substrate 100 according to the embodiments of the present disclosure also includes a buffer layer 40 disposed on the substrate 10. As shown in FIG. 1, in the embodiments of the present disclosure, the buffer layer 40 includes a first buffer structure 41 and a second buffer structure 42 partially disposed on the first buffer structure 41, and the material of the first buffer structure 41 is different from the material of the second buffer structure 42.

In some embodiments, the substrate 10 may be a semiconductor substrate. For example, the material of the substrate 10 may include silicon, silicon germanium, gallium nitride, gallium arsenide, any other applicable semiconductor material, or a combination thereof. In some embodiments, the substrate 10 may be a semiconductor-on-insulator substrate, such as a silicon-on-insulator (SOI) substrate. In some embodiments, the substrate 10 may be a glass substrate or a ceramic substrate. For example, the material of the substrate 10 may include silicon carbide (SiC), aluminum nitride (AlN), glass, or sapphire, but the present disclosure is not limited thereto.

In some embodiments, the first buffer structure 41 may be an insulating layer. For example, the material of the first buffer structure 41 may include an insulating material, such as $Si_xN_y$, $Si_xGaN_y$, or $Si_xO_y$, where 0<x≤3 and 0<y≤3, but the present disclosure is not limited thereto. In some embodiments, the material of the second buffer structure 42 may include a semiconductor material, such as $AlGa_zN$, where 0≤z≤1, and the material of the second buffer structure 42 is preferred a semiconductor insulating material, but the present disclosure is not limited thereto. In some embodiments, the first buffer structure 41 may be SiN and the second buffer structure 42 may be AlN, which may provide a better buffer effect on the substrate 10 that includes silicon materials to reduce the stress during the epitaxial process.

In some embodiments, the area of the orthographic projection of the first buffer structure 41 on the substrate 10 is different from the area of the orthographic projection of the second buffer structure 42 on the substrate 10. For example, the ratio of the area of the orthographic projection of the first buffer structure 41 on the substrate 10 to the area of the orthographic projection of the second buffer structure 42 on the substrate 10 is between 10% and 90%. If the ratio is less than 10% or more than 90%, the buffering of the stress change is insufficient, but the present disclosure is not limited thereto. In some embodiments, the area of the orthographic projection of the first buffer structure 41 on the substrate 10 is less than the area of the orthographic projection of the second buffer structure 42 on the substrate 10, and the ratio of the area of the orthographic projection of the first buffer structure 41 on the substrate 10 to the area of the orthographic projection of the second buffer structure 42 on the substrate 10 is between 10% and 50%, so that subsequent epitaxy may have better quality.

Moreover, as shown in FIG. 1, in some embodiments, the second buffer structure 42 is partially disposed on a surface 41T of the first buffer structure 41, and the ratio of the area of the second buffer structure 42 disposed on the surface 41T of the first buffer structure 41 to the area of the surface 41T of the first buffer structure 41 may be between 10% and 50%. If the ratio is less than 10% or more than 50%, the buffering of the stress change is insufficient, but the present disclosure is not limited thereto.

Referring to FIG. 1, the semiconductor substrate 100 according to the embodiments of the present disclosure further includes a first semiconductor layer 31 disposed on the buffer layer 40. In some embodiments, the material of the first semiconductor layer 31 may include gallium nitride, aluminum gallium nitride, indium gallium nitride, aluminum indium gallium nitride, any other applicable material, or a combination thereof. In some embodiments, the first semiconductor layer 31 may be an undoped semiconductor layer. In some embodiments, the first semiconductor layer 31 may be in direct contact with the buffer layer 40. That is, the first semiconductor layer 31 may be in contact with a portion of the surface 41T of the first buffer structure 41 and the first semiconductor layer 31 may be in contact with the surface 42T of the second buffer structure 42, which may improve the growth quality of the subsequent epitaxial layer, but the present disclosure is not limited thereto. In some embodiments, the first semiconductor layer 31 may be formed by an epitaxial process, such as metal organic chemical vapor deposition (MOCVD), but the present disclosure is not limited thereto.

Referring to FIG. 2, in some embodiments, the first buffer structure 41 has a plurality of first sub-regions 410, and at least some intervals of the first sub-regions 410 are different. For example, in FIG. 2, the interval D1 between two adjacent first sub-regions 410 and the interval D1' between the other two adjacent first sub-regions 410 may be different, but the present disclosure is not limited thereto. In some embodiments, the interval D1 and the interval D1' may also be the same.

Similarly, the second buffer structure 42 has a plurality of second sub-regions 420, and at least some intervals of the second sub-regions 420 are different. For example, in FIG. 2, the interval D2 between two adjacent second sub-regions 420 and the interval D2' between the other two adjacent second sub-regions 420 may be different, but the present disclosure is not limited thereto. In some embodiments, the interval D2 and the interval D2' may also be the same.

Moreover, the interval of two adjacent first sub-regions 410 and the interval of two adjacent second sub-regions 420 may be different. For example, the interval D1 (or D1') of two adjacent first sub-regions 410 and the interval D2 (or D2') of two adjacent second sub-regions 420 may be different, but the present disclosure is not limited thereto. In some embodiments, the interval D1 (or D1') and the interval D2 (or D2') may also be the same.

Figure 3:
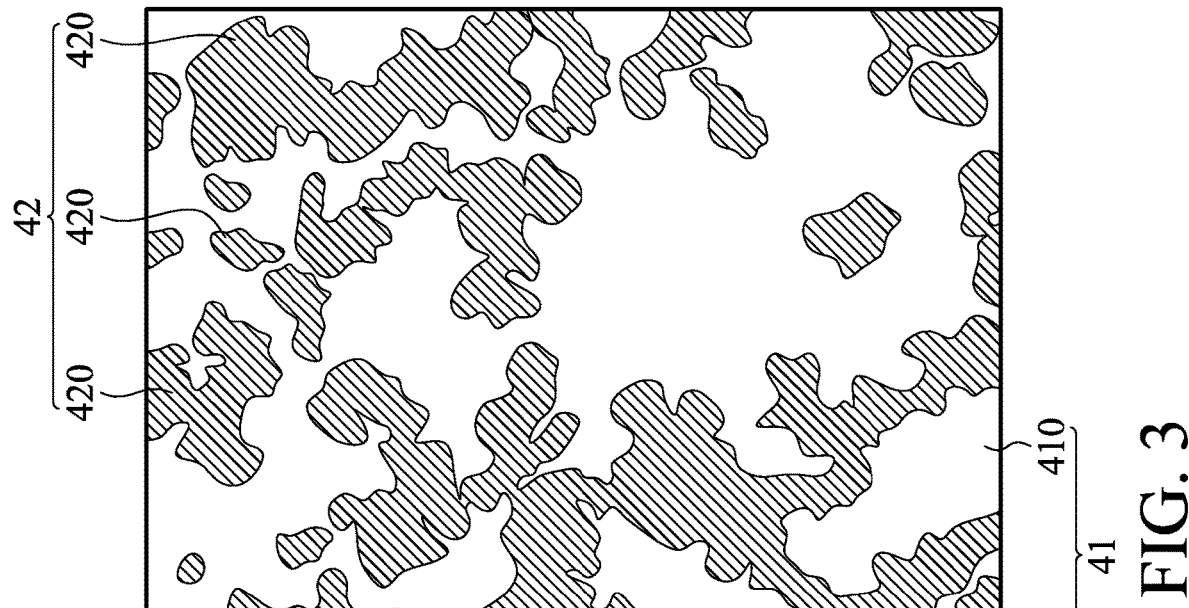
FIG. 3 is a partial top view illustrating the buffer layer.

FIG. 3 is a partial top view illustrating the buffer layer 40. Referring to FIG. 1 and FIG. 3, in this embodiment, the first sub-regions 410 of the first buffer structure 41 and the second sub-regions 420 of the second buffer structure 42 may form a continuous structure. In other words, the orthographic projection of the first buffer structure 41 on the substrate 10 and the orthographic projection of the second buffer structure 42 on the substrate 10 at least partially overlap on the substrate 10.

More specifically, the orthographic projection of the first buffer structure 41 on the substrate 10 and the orthographic projection of the second buffer structure 42 on the substrate 10 may cover the substrate 10, which may block most of the dislocation of the subsequent epitaxial semiconductor layer under the buffer layer 40, and reduce the thickness required for lateral growth of the subsequent epitaxial layer, thereby effectively improving the quality of the semiconductor structure 100. In addition, the first sub-regions 410 and the second sub-regions 420 may be staggered with each other, but the present disclosure is not limited thereto.

As shown in FIG. 1 to FIG. 3, each first sub-region 410 of the first buffer structure 41 and each second sub-region 420 of the second buffer structure 42 may be formed in an irregular shape. For example, the first buffer structure 41 and the second buffer structure 42 can be formed by an epitaxial process. Therefore, each of the first sub-regions 410 may have irregular sidewalls, and each of the second sub-regions 420 may have irregular sidewalls, which may provide a larger buffer surface and reduce the thickness required for lateral growth of the subsequent epitaxial layer. In the conventional technology, the buffer layer is formed by a photolithography process, so that the sidewall of the buffer layer is formed to be flat and vertical. Therefore, it requires the subsequent epitaxial layer to be laterally grown to a certain thickness to avoid dislocation formation. Compared with the conventional technology, in the embodiments of the present disclosure, it is not necessary to laterally grow the subsequent epitaxial layer to a required thickness, and it may already provide a good buffering capacity.

Moreover, each of the first sub-regions 410 of the first buffer structure 41 and each of the second sub-regions 420 of the second buffer structure 42 according to the embodiments of the present disclosure are arranged non-periodically and randomly formed on the substrate 10, which may effectively adjust random stress changes in the epitaxy to increase the quality of the epitaxy.

As shown in FIG. 2, in some embodiments, the thickness T2 of the second buffer structure 42 is greater than the thickness T1 of the first buffer structure 41. It should be noted that since each first sub-region 410 of the first buffer structure 41 and each second sub-region 420 of the second buffer structure 42 may be formed in an irregular shape, the thickness T1 of the first buffer structure 41 may be defined as the maximum thickness of all the first sub-regions 410 in the direction F away from the substrate 10, and the thickness T2 of the second buffer structure 42 may be defined as the maximum thickness of all the second sub-regions 420 in the direction F away from the substrate 10. In some embodiments, the thickness of the buffer layer 40 may be between 1 nm and 200 nm, but the present disclosure is not limited thereto. Here, the thickness of the buffer layer 40 may be defined as the maximum sum of the thickness T1 of the first buffer structure 41 and the thickness T2 of the second buffer structure 42.

In particular, the first semiconductor layer 31 may be disposed between a surface (e.g., the surface 41T of the first buffer structure 41 shown in FIG. 1) of each first sub-region 410 and the second sub-regions 420, which may reduce the thickness required for lateral growth of the subsequent epitaxial layer. In some embodiments, the contact area of the first semiconductor layer 31 and the first buffer structure 41 is smaller than the contact area of the first semiconductor layer 31 and the second buffer structure 42, but the present disclosure is not limited thereto.

Since the second buffer structure 42 may include a semiconductor material (e.g., $AlGa_zN$, where $0 \leq z \leq 1$), which has a high degree of cooperation with the first semiconductor layer 31, compared to the conventional use of a silicon nitride mask alone as a buffer layer, the semiconductor structure 100 according to the embodiments of the present disclosure has less stress change during completion of epitaxy and lowering the temperature to room temperature, which may effectively prevent the semiconductor structure 100 from cracking.

Referring to FIG. 1 and FIG. 2, the semiconductor substrate 100 according to the embodiments of the present disclosure includes a second semiconductor layer 32 disposed between the substrate 10 and the buffer layer 40.

In some embodiments, the material of the second semiconductor layer 32 is the same as the material of the first semiconductor layer 31. For example, the material of the second semiconductor layer 32 may include gallium nitride, aluminum gallium nitride, indium gallium nitride, aluminum indium gallium nitride, any other applicable material, or a combination thereof, and similarly, the second semiconductor layer 32 may be an undoped semiconductor layer, but the present disclosure is not limited thereto. In some embodiments, the second semiconductor layer 32 may be formed by an epitaxial process, such as metal organic chemical vapor deposition (MOCVD), hydride vapor phase epitaxy (HVPE), molecular beam epitaxy (MBE), any other applicable process, or a combination thereof, but the present disclosure is not limited thereto.

In some embodiments, the thickness of the second semiconductor layer 32 may be smaller than the thickness of the first semiconductor layer 31. In the embodiments of the present disclosure, since the first semiconductor layer 31 is formed after the second semiconductor layer 32 and the buffer layer 40 are formed, and the buffer layer 40 is disposed between the first semiconductor layer 31 and the second semiconductor layer 32 to provide a buffer, it is possible to provide a good epitaxial quality of the first semiconductor layer 31 that is formed subsequently.

In some embodiments, the density of the dislocation (TD) of the first semiconductor layer 31 is smaller than the density of the dislocation of the second semiconductor layer 32. In particular, there is a large lattice mismatch between the substrate 10 and the second semiconductor layer 32, which may cause a high-density dislocation (TD). However, since the buffer layer 40 is disposed between the first semiconductor layer 31 and the second semiconductor layer 32, and the buffer layer 40 includes a first buffer structure 41 (e.g., $Si_xN_y$, where $0<x\leq3$ and $0<y\leq3$) and a second buffer structure 42 (e.g., $AlGa_zN$, where $0\leq z\leq1$), compared to the conventional technology, which uses a silicon nitride mask as a buffer layer alone and the first semiconductor layer is in partial contact with the second semiconductor layer (such that the dislocation may not be completely blocked), the continuous first buffer structure 41 and second buffer structure 42 of the buffer layer 40 according to the embodiments of the present disclosure may block most of the dislocation under the buffer structure 40, and reduce the thickness required for lateral growth of the subsequent epitaxial layer, thereby effectively improving the quality of the semiconductor structure 100.

Furthermore, since the second buffer structure 42 has a high degree of cooperation with the first semiconductor layer 31, less stress change occurs during completion of epitaxy and lowering the temperature to room temperature, which may effectively prevent the semiconductor structure 100 from cracking.

Referring to FIG. 1, the semiconductor substrate 100 according to the embodiments of the present disclosure also includes a growth layer 20 disposed on the substrate 10. In particular, the growth layer 20 is disposed between the substrate 10 and the second semiconductor layer 32. In some embodiments, the material of the growth layer 20 may include silicon (Si), aluminum nitride (AlN), gallium nitride (GaN), aluminum gallium nitride (AlGaN), silicon carbide (SiC), any other applicable material, or a combination thereof, but the present disclosure is not limited thereto. The growth layer 20 may be a single-layer or multi-layer structure. In some embodiments, the growth layer 20 may be formed by an epitaxial growth process, but the present disclosure is not limited thereto.

In particular, the material of the growth layer 20 may include $Al_mGa_{1-m}N$, where $0\leq m\leq 1$. In the embodiment shown in FIG. 1, the growth layer 20 is a multi-layer structure. For example, the growth layer 20 may include a first sub-layer 21 and a second sub-layer 23 disposed on the first sub-layer 21, and the first sub-layer 21 may be AlN, but the present disclosure is not limited thereto.

In some embodiments, the aluminum content of the second sub-layer 23 gradually decreases in the direction away from the substrate 10 (e.g., direction F shown in FIG. 1). Moreover, the aluminum content of the second sub-layer 23 varies continuously in the direction away from the substrate 10. Alternatively, the aluminum content of the second sub-layer 23 varies stepwise in the direction away from the substrate 10. However, the present disclosure is not limited thereto. In some embodiments, the aluminum content of the second sub-layer 23 may also be constant.

In summary, in the semiconductor structure according to the embodiments of the present disclosure, since the buffer layer is disposed between the first semiconductor layer and the second semiconductor layer, and the buffer layer includes a first buffer structure and a second buffer structure, most of the dislocation may be blocked under the buffer structure, thereby effectively improving the quality of the semiconductor structure.

Moreover, since the second buffer structure has a high degree of cooperation with the first semiconductor layer, less stress change occurs during completion of epitaxy and lowering the temperature to room temperature, which may effectively prevent the semiconductor structure from cracking.

Furthermore, the lateral growth of the first semiconductor layer to a certain thickness is not required for the semiconductor structure according to the embodiments of the present disclosure, which may effectively exclude most of the dislocation and may reduce the manufacturing cost of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor structure, comprising:
a substrate;
a buffer layer disposed on the substrate;

a first semiconductor layer disposed on the buffer layer; and a second semiconductor layer disposed between the substrate and the buffer layer;

wherein the buffer layer comprises a first buffer structure and a second buffer structure partially disposed on the first buffer structure, a material of the first buffer structure is different from a material of the second buffer structure, the first buffer structure has a plurality of first sub-regions, the second buffer structure has a plurality of second sub-regions, each of the first sub-regions is irregular, and each of the second sub-regions is irregular, a density of the dislocation of the first semiconductor layer is smaller than a density of the dislocation of the second semiconductor layer.

2. The semiconductor structure according to claim 1, wherein a thickness of the second buffer structure is greater than a thickness of the first buffer structure.

3. The semiconductor structure according to claim 1, wherein a contact area of the first semiconductor layer and the first buffer structure is smaller than a contact area of the first semiconductor layer and the second buffer structure.

4. The semiconductor structure according to claim 1, wherein a ratio of an area of an orthographic projection of the first buffer structure on the substrate to an area of an orthographic projection of the second buffer structure on the substrate is between 10% and 90%.

5. The semiconductor structure according to claim 1, wherein at least some intervals of the first sub-regions are different, and at least some intervals of the second sub-regions are different.

6. The semiconductor structure according to claim 5, wherein the first semiconductor layer is disposed between a surface of each of the first sub-regions and the second sub-regions.

7. The semiconductor structure according to claim 5, wherein the first sub-regions and the second sub-regions form a continuous structure.

8. The semiconductor structure according to claim 5, wherein two adjacent first sub-regions have a first interval, two adjacent second sub-regions have a second interval, and the first interval is different from the second interval.

9. The semiconductor structure according to claim 5, wherein each of the first sub-regions has irregular sidewalls, and each of the second sub-regions has irregular sidewalls.

10. The semiconductor structure according to claim 1, wherein the material of the first buffer structure includes an insulating material, and the material of the second buffer structure includes a semiconductor material.

11. The semiconductor structure according to claim 1, wherein a material of the first semiconductor layer is the same as a material of the second semiconductor layer.

12. The semiconductor structure according to claim 1, wherein the second buffer structure is partially disposed on a surface of the first buffer structure, and a ratio of an area of the second buffer structure disposed on the surface of the first buffer structure to an area of the surface of the first buffer structure is between 10% and 50%.

* * * * *